United States Patent
Pei et al.

(10) Patent No.: US 9,846,088 B2
(45) Date of Patent: Dec. 19, 2017

(54) DIFFERENTIAL ACOUSTIC TIME OF FLIGHT MEASUREMENT OF TEMPERATURE OF SEMICONDUCTOR SUBSTRATES

(71) Applicant: TOKYO ELECTRON LIMITED, Minato-ku (JP)

(72) Inventors: Jun Pei, Saratoga, CA (US); Junwei Bao, Los Altos, CA (US); Holger Tuitje, Fremont, CA (US); Ching-Ling Meng, Sunnyvale, CA (US); Mihail D. Mihaylov, San Jose, CA (US)

(73) Assignee: TOKYO ELECTRON LIMITED, Minato-ku (JP)

( * ) Notice: Subject to any disclaimer, the term of this patent is extended or adjusted under 35 U.S.C. 154(b) by 567 days.

(21) Appl. No.: 14/490,430

(22) Filed: Sep. 18, 2014

(65) Prior Publication Data
US 2015/0078416 A1    Mar. 19, 2015

Related U.S. Application Data

(60) Provisional application No. 61/879,552, filed on Sep. 18, 2013.

(51) Int. Cl.
  *G01K 11/22* (2006.01)
  *G01K 11/24* (2006.01)
  *H01L 21/67* (2006.01)
(52) U.S. Cl.
  CPC ........ *G01K 11/24* (2013.01); *H01L 21/67248* (2013.01)

(58) Field of Classification Search
  None
  See application file for complete search history.

(56) References Cited

U.S. PATENT DOCUMENTS

| 5,996,415 | A | * | 12/1999 | Stanke | ............... | G01N 29/041 374/119 |
| 7,668,665 | B2 | * | 2/2010 | Kim | ............... | G01H 9/004 702/33 |
| 2003/0016727 | A1 | | 1/2003 | Jones et al. | | |

* cited by examiner

Primary Examiner — Erica Lin
(74) Attorney, Agent, or Firm — Oblon, McClelland, Maier & Neustadt, L.L.P.

(57) ABSTRACT

Disclosed is a method and apparatus for measuring semiconductor substrate temperature using a differential acoustic time of flight measurement technique. The measurement is based on measuring the time of flight of acoustic (ultrasonic) waves across the substrate, and calculating a substrate temperature from the measured time of flight and the known temperature dependence of the speed of sound for the substrate material. The differential acoustic time of flight method eliminates most sources of interference and error, for example due to varying coupling between an ultrasonic transducer and the substrate. To further increase the accuracy of the differential acoustic time of flight measurement, a correlation waveform processing algorithm is utilized to obtain a differential acoustic time of flight measurement from two measured ultrasonic waveforms. To facilitate signal recognition and processing, a symmetric Lamb mode may be used as mode of excitation of the substrate.

20 Claims, 5 Drawing Sheets

US 9,846,088 B2

DIFFERENTIAL ACOUSTIC TIME OF FLIGHT MEASUREMENT OF TEMPERATURE OF SEMICONDUCTOR SUBSTRATES

CROSS REFERENCE TO RELATED APPLICATIONS

This application is based on and claims the benefit of and priority to U.S. Provisional Patent Application No. 61/879,552, entitled "DIFFERENTIAL TIME OF FLIGHT MEASUREMENT OF ACOUSTIC WAVES FOR SEMICONDUCTOR WAFERS", filed on Sep. 18, 2013, the entire contents of which are herein incorporated by reference.

BACKGROUND OF THE INVENTION

Field of the Invention

The present invention relates to a method and apparatus for measuring the temperature of a semiconductor substrate, particularly in-situ during semiconductor processing.

Description of Related Art

Production of semiconductor devices, displays, photovoltaics, etc., proceeds in a sequence of steps, each step having parameters optimized for maximum device yield. Among the controlled parameters strongly affecting yield is the temperature of the substrate from which devices are formed, because temperature strongly affects the rate of and outcome of a processing step. While ensuring that the temperature of the substrate is within limits for each processing step, it is also equally important to maintain temperature steady over time, i.e. from substrate to substrate, and substrate lot to substrate lot, to prevent process drift. It is also very important to maintain uniformity of temperature across the substrate during each processing step, such that properties of devices do not vary considerably from one region of the substrate to another.

The goal of maintaining control of substrate temperature, and its uniformity across the substrate and over multiple substrates requires monitoring of substrate temperature during processing, preferably across multiple locations on the substrate. Active monitoring of substrate temperature is frequently complicated by the fact that processing occurs in harsh and unfavorable environments. For example, in situ temperature measurement devices need to be unaffected by the aggressive chemistries and environments (e.g. plasma) sometimes used in semiconductor processing. In plasma processing environments, strong RF coupling from the RF excitation method used to drive a plasma in the plasma processing system can lead to noisy and erroneous temperature measurements due to induced currents in unshielded or poorly-shielded temperature sensor circuits. Some temperature measurement methods have sought to solve these issues by placing temperature sensors inside the substrate support, but such a measurement is further complicated by the fact that the substrate is seldom in good thermal contact with the substrate support, so the reading of the temperature sensors embedded within the substrate support is rarely accurate due to the temperature difference (i.e. "jump") between the substrate and the substrate support. Attempts to directly measure the substrate temperature have typically involved some sort of single or multi-point optical temperature measurement system installed inside the processing chamber, but such system also have their shortcomings, such as the tendency of optical components to get coated with processing byproducts adhering to the wall of the processing chamber, thus affecting measurement accuracy; and also high cost.

Therefore, there still exists a need for a robust and inexpensive system and associated method for measuring a temperature and temperature distribution of a substrate itself, during processing. Direct ultrasonic measurement of substrate temperature, particularly as described hereinafter, addresses most of the aforementioned concerns.

SUMMARY OF THE INVENTION

An aspect of the invention includes a method for determining the temperature of a substrate, comprising disposing the substrate on a substrate support; contacting the substrate with a first ultrasonic transducer; contacting the substrate with a second ultrasonic transducer; exciting a Lamb wave in the substrate by energizing the first ultrasonic transducer and the second ultrasonic transducer; measuring at the second ultrasonic transducer a first ultrasonic waveform of the Lamb wave originating at the first ultrasonic transducer and propagating along a first path from the first ultrasonic transducer to the second ultrasonic transducer; measuring at the second ultrasonic transducer a second ultrasonic waveform of the Lamb wave originating from the first ultrasonic transducer and propagating along a second path from the first ultrasonic transducer to the second ultrasonic transducer, wherein the second path is different than the first path; calculating a difference of times of flight of the second ultrasonic waveform and the first ultrasonic waveform, and determining the substrate temperature from the calculated difference of times of flight and from a known temperature dependence of the speed of sound for the substrate material. The second path is generally longer than the first path, and can include at least one reflection from the substrate edge, while the ultrasonic transducers can contact the substrate in many different configurations, including diametrally-opposed, next to each other but not touching each other, etc. Another aspect of the invention is that the Lamb wave can be symmetric.

Yet another aspect of the invention is related to the calculation of the difference of times of flight comprising converting the first ultrasonic waveform into a first wavelet representation; converting the second ultrasonic waveform into a second wavelet representation, and determining the difference of times of flight from a calculated correlation of the first and second wavelet representations.

Further aspects of the invention include a controller for controlling and powering the ultrasonic transducers, measuring ultrasonic waveforms, calculating the difference of times of flight of ultrasonic waveforms, and further calculating the substrate temperature from the difference of times of flight. Another aspect includes actuators for selectably bringing into contact with, or withdrawing from the substrate, the ultrasonic transducers.

Yet another aspect of the invention includes a method for determining the temperature distribution across a substrate, comprising disposing the substrate on a substrate support; contacting the substrate with a plurality of ultrasonic transducers; measuring a plurality of substrate temperatures in a plurality of substrate zones, each temperature measurement in each substrate zone comprising: selecting a substrate zone in which the substrate temperature is to be measured; exciting a Lamb wave in the substrate by energizing a selected pair of ultrasonic transducers from the plurality of ultrasonic transducers; measuring at a second ultrasonic transducer of the selected pair of ultrasonic transducers a first ultrasonic waveform of the Lamb wave originating at a first ultrasonic transducer of the selected pair of ultrasonic transducers and propagating along a first path from the first ultrasonic transducer of the selected pair of ultrasonic transducers to the second ultrasonic transducer of the selected pair of ultrasonic transducers; measuring at the second ultrasonic transducer of the selected pair of ultrasonic transducers a second ultrasonic waveform of the Lamb wave originating from the first ultrasonic transducer of the selected pair of ultrasonic transducers and propagating along a second path from the first ultrasonic transducer of the selected pair of ultrasonic transducers to the second ultrasonic transducer of the selected pair of ultrasonic transducers, wherein the second path is different than the first path; calculating a difference of times of flight of the second ultrasonic waveform and the first ultrasonic waveform; determining a temperature of the selected substrate zone from the calculated difference of times of flight and from a known temperature dependence of the speed of sound for the substrate material. Another aspect of the invention is that the Lamb wave can be symmetric. Yet another related aspect includes selecting a functional form for the temperature distribution of the substrate, the selected functional form having a plurality of floating parameters; and calculating the plurality floating parameters by fitting the plurality of substrate temperatures measured in the plurality of substrate zones, so a temperature distribution of the substrate is obtained. The fitting can be done using algorithms such as regression, or using tomographic inversion algorithms.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF EXEMPLARY EMBODIMENTS

Figure 1:
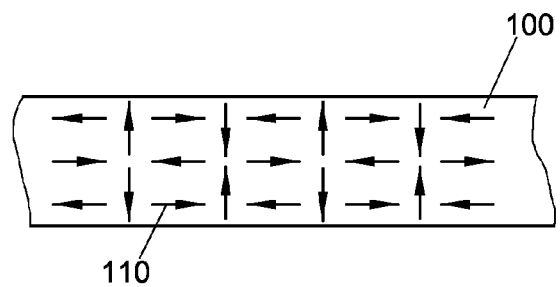
FIG. 1 is a schematic of the displacement field induced in a substrate in which a symmetric Lamb wave is excited, for example, by ultrasonic transducers.

In the following description, in order to facilitate a thorough understanding of the invention and for purposes of explanation and not limitation, specific details are set forth, such as particular geometries of a substrate temperature measurement system, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Ultrasonic substrate temperature measurement systems operate on the principle of measuring the speed of propagation of sound in the substrate, which is depends on the substrate temperature. A change of substrate temperature thus causes a measurable change of speed of propagation of sound. The coefficient of temperature dependence of speed of sound in a metallic or semiconductor substrate is of the order of $10^{-5}$. This is a small value, but advances in signal processing, both in terms of hardware and software algorithms have made it feasible to measure the small change of speed of sound induced by temperature change in a substrate. The ability for a system and method to accurately measure speed of sound, and thus substrate temperature, depends on the ability to accurately determine the time of flight that an ultrasonic waveform takes to traverse the substrate from one transducer to another.

Acoustic waves induced in a thin plate-like substrate whose thickness is much smaller than the acoustic wavelength are called Lamb waves. One of the problems encountered in prior art ultrasonic temperature measurement systems stems from the strongly dispersive nature of Lamb waves induced in a thin substrate by a typical prior art ultrasonic excitation and measurement configuration wherein one transducer is used to excite the Lamb wave, and another transducer, generally located on the opposite side of the substrate is used to measure the acquired waveform and determine the time of flight of the ultrasonic wave, from which the speed of sound, and thus temperature can both be determined. The type of Lamb wave induced by this configuration is called a antisymmetric Lamb wave, and its strongly dispersive nature, i.e. tendency for various frequency components of the wave to propagate at different velocities means that by the time the waveform reaches the measuring transducer, the waveform is itself modified by dispersion, sometimes beyond recognition, which causes a lot of difficulty for accurate determination of time of flight, which is key to accurate temperature measurement.

The inventors have overcome this limitation by inducing another form of Lamb wave, i.e. a symmetric Lamb wave, whose displacement field is schematically depicted in FIG. 1. As can be seen from FIG. 1, the displacement field of the symmetric Lamb wave in a substrate is symmetric with respect to the central plane of the thin substrate, the central plane being parallel to the flat substrate sides. Moreover, the dispersion of a symmetric Lamb wave is significantly lower than the dispersion of an antisymmetric Lamb wave, making it particularly suitable for ultrasonic temperature measurement, because propagating waveforms tend to maintain their shape better, making it easier to recognize them at the receiving transducer and thus making the time of flight measurement easier. The symmetric nature of the wave further implies that two ultrasonic transducers are needed to excite a symmetric Lamb wave in the substrate, unlike the prior art where only a single transducer is used to excite the wave.

Figure 2:
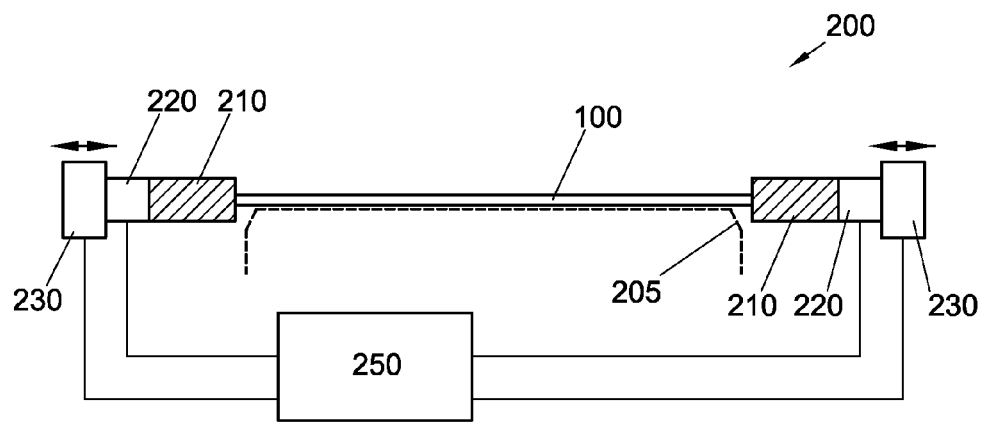
FIG. 2 is a schematic of the substrate temperature measurement system in accordance with an embodiment of the invention.

FIG. 2 shows a schematic of an substrate temperature measurement system 200 in accordance with an embodiment of the invention. A substrate 100 is mounted generally atop a substrate support 205, such as an electrostatic chuck. In other embodiments, the substrate may be supported by edge supports, or by a plurality of lift pins, depending on the configuration of the processing system in which the substrate temperature measurement system 200 is used. At least two transducers 220 contact the edge of the substrate 100 via buffer rods 210, to excite a symmetric Lamb wave in substrate 100. Buffer rods 210 can be made or quartz, for example. To allow placement and removal of substrate 100 from substrate support 205, actuators 230 can be optionally used to selectably bring into contact and withdraw from the edge of substrate 100, the transducers 220 and buffer rods 210. In other embodiments, transducers 220 can be mounted in a position to contact other portions of the substrate 100, such as the lower side of substrate 100 (not shown). Transducers 220 are also used to measure ultrasonic waveforms. To facilitate signal recognition and processing, transducers 220 may be operated in pulsed mode.

A controller 250 is connected to the transducers 220 and optional actuators 230 for controlling and powering the transducers 220 and actuators 230, and also to acquire and measure ultrasonic waveforms from transducers 220. The controller 250 is also configured to do signal processing on all measured ultrasonic waveforms, to determine the times of flight, and to determine the substrate temperature from the time of flight data.

Figures 3A, 3B:
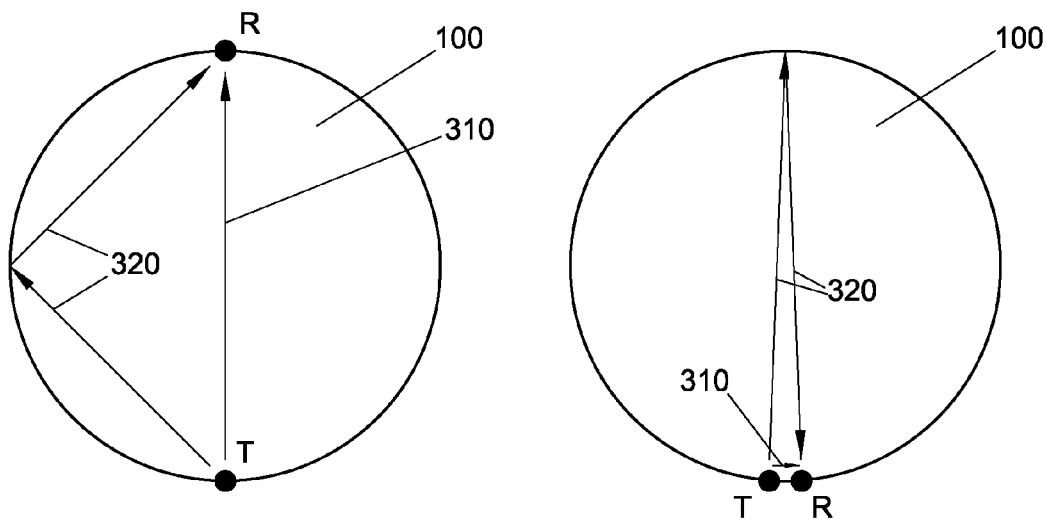
FIG. 3A is a schematic of locations of ultrasonic transducers relative to the substrate, and the resultant ultrasonic wave propagation pattern, in accordance with an embodiment of the invention.
FIG. 3B is a schematic of locations of ultrasonic transducers relative to the substrate, and the resultant ultrasonic wave propagation pattern, in accordance with another embodiment of the invention.

FIGS. 3A and 3B show two different configurations of ultrasonic transducers contacting the edge of the substrate 100. The configuration in FIG. 3A will be used now to explain another important aspect of the invention, i.e. differential time of flight measurement.

In prior art systems, time of flight measurements are typically made from the instant of introducing excitation at a first ultrasonic transducer to the time when the acoustic wave has reached the second ultrasonic transducer where the signal is received. This configuration has the disadvantage that there is no way to factor out the effects on the time of flight measurement introduced by time of flight along buffer rods 210 and due to any variations in coupling of ultrasonic transducers to the substrate, for example. Temperature variations during substrate processing can themselves induce significant variations in the coupling and the time of flight along the coupling hardware, which in the aforementioned setup are impossible to remove from the acquired signal. Other factors that influence the time of flight measurement include mechanical effects such as the repeatability of contact of transducers and the substrate, and the effects of substrate chucking, as when electrostatic chucks 205 are used.

To overcome these issues and make the time of flight measurement as insensitive to these external factors, as possible, the inventors utilize differential time of flight measurements. In a differential time of flight measurement, at least two actual time of flight measurements are made. In the exemplary configuration in FIG. 3A, where the two ultrasonic transducers T and R are spaced apart in diametrally-opposing locations with respect to the substrate 100, the first time of flight measurement would be taken of the time it takes the acoustic wave originating at ultrasonic transducer T to reach ultrasonic transducer R along the shortest, diametral path 310. In ultrasonic measurements, multiple reflections of the acoustic wave are typically present depending on the geometric configuration of the sample, i.e. the substrate 100. For example, one particularly strong reflected acoustic wave is associated with propagation sideways from ultrasonic transducer T, reflecting off of the substrate edge, and approaching the receiving ultrasonic transducer R sideways, which is depicted in FIG. 3A as path 320. Since the same ultrasonic transducers T and R are used to determine the time of flight along both paths, at the same instant and using the same excitation, the two time of flight measurements along both paths 310 and 320 are equally affected by coupling variations, temperature variations, substrate chucking, etc. Therefore, if the time of flight along path 310 is subtracted from the longer time of flight along path 320, the resultant differential time of flight measurement has all coupling variations, temperature variations, and other effects subtracted out, and the resultant differential time of flight measurement is only dependent on the known difference in lengths of paths 320 and 310, which is a known geometrical quantity, and the speed of sound in the material of which the substrate 100 is made, which is also known, and is directly related to the temperature of the substrate along paths 310 and 320.

FIG. 3B shows an alternate embodiment in which ultrasonic transducers T and R are located in close proximity to each other and contact the edge of substrate 100 without touching each other. In this case, the shortest path 310 is directly from ultrasonic transducer T to ultrasonic transducer R, while the longer reflected path 320 involves traversing the substrate 100 twice along a substantially diametral path. Again, as in FIG. 3A, the effects of coupling variations, temperature variations, chucking, etc., are subtracted out, while the differential time of flight measurement substantially depends only on the length of path 320 and the speed of sound, and thus substrate temperature along path 320.

Figure 4:
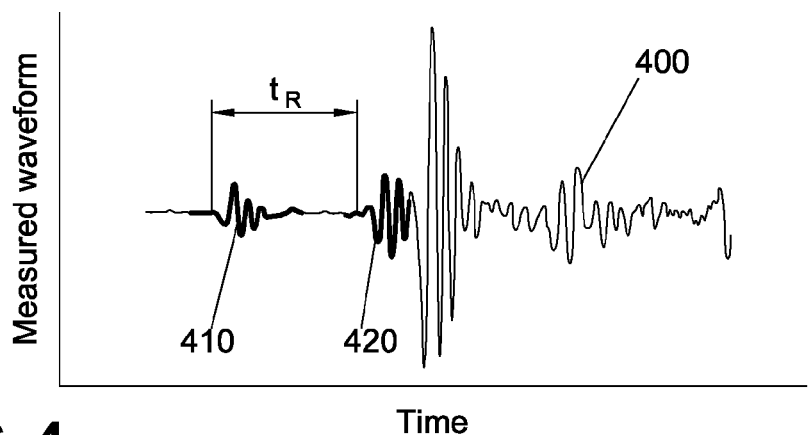
FIG. 4 is a graph of ultrasonic waveforms measured by a method in accordance with an embodiment of the invention.

FIG. 4 shows an typical oscilloscope trace 400 of the measured pulsed ultrasonic waveform acquired at e.g. ultrasonic transducer T of FIG. 3A or 3B. The first waveform 410 corresponds to propagation of the symmetric Lamb wave along the shorter path 310 of FIG. 3A or 3B, while the second waveform 420 corresponds to propagation of the symmetric Lamb wave along the longer reflected path 320 of FIG. 3A or 3B. The difference of times of flight $t_R$ is directly related to the difference of lengths of paths 320 and 310, and the speed of sound, and thus temperature along paths 320 and 310, as explained before.

An accurate measurement of the difference of times of flight $t_R$ represents a challenge in prior art ultrasonic temperature measurement systems, because the use of an antisymmetric Lamb wave excitation, with the highly dispersive nature of the propagating acoustic wave causes the longer-propagating waveform 420 to lose all resemblance to waveform 410, making signal recognition difficult, and rendering any measurements of the difference of times of flight $t_R$ inaccurate.

Figure 5:
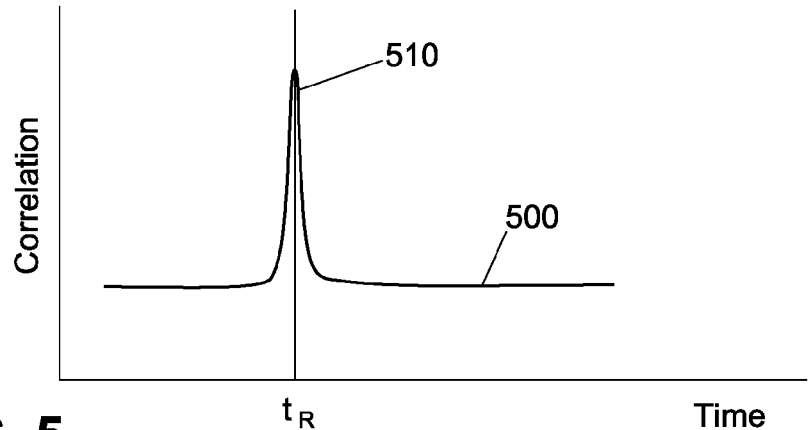
FIG. 5 is a graph of the correlation of wavelet representations of two measured ultrasonic waveforms, used to determine the difference of times of flight of ultrasonic waveforms in accordance with an embodiment of the invention.

However, with the symmetric Lamb wave excitation in accordance with an embodiment of the present invention, the low dispersion of the symmetric Lamb wave ensures that waveforms 410 and 420 are substantially similar and thus easily recognizable, which eases signal acquisition and processing. For example, the difference of times of flight $t_R$ can be determined, in one embodiment, by simply subtracting the times of first zero crossings (i.e. first zero amplitudes) of the two waveforms 420 and 410. However, the inventors have found a more accurate way of determining the difference of times of flight $t_R$, using wavelet transformation. Because the waveforms 410 and 420 are similar due to the substantially nondispersive nature of the symmetric Lamb wave, they can be converted to a wavelet representation using a same previously acquired seed waveform. Once converted to wavelet representations, the process of determining the difference of times of flight $t_R$ involves calculating the correlation of the wavelet representations of the first waveform 410 and the second waveform 420, wherein the peak of the correlation corresponds to the time "shift", i.e. the difference of times of flight $t_R$ of the two waveforms 410 and 420. An exemplary correlation 500 is depicted in the graph in FIG. 5, where the peak 510 is located at the difference of times of flight $t_R$, which is the quantity that needs to be determined so the speed of sound and thus substrate temperature can be calculated from the known geometry of the propagation paths and the known relationship between the speed of sound and temperature for the material of which the substrate is made.

Figure 6:
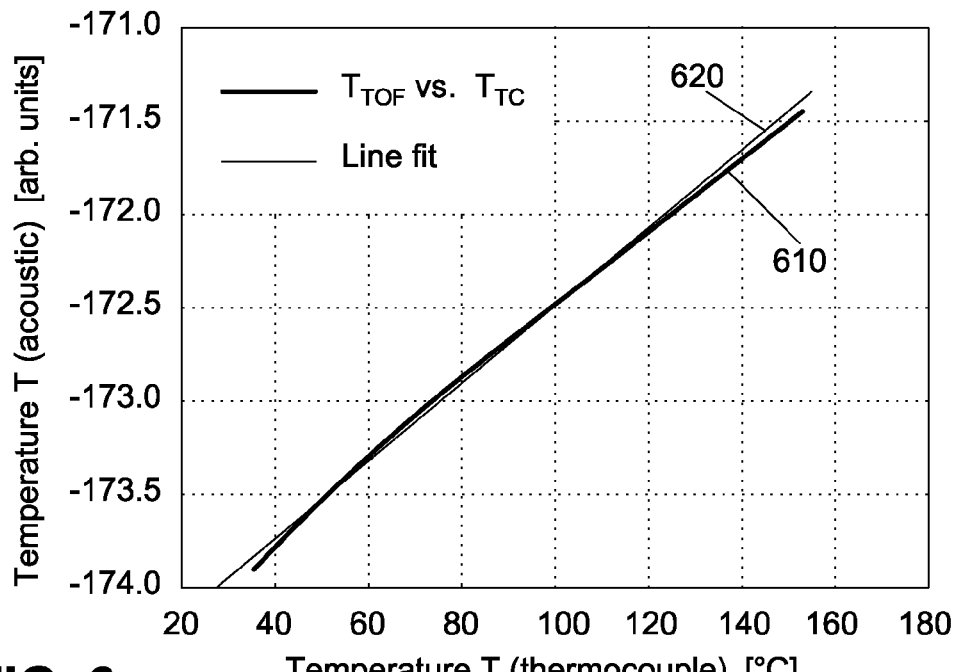
FIG. 6 is a graph comparing substrate temperature measured using an embodiment of the invention compared to measurements using thermocouples.

FIG. 6 shows a correlation of substrate temperature measured with the differential time of flight method $T_{TOF}$ and substrate temperature measured using a thermocouple $T_{TC}$ (trace 610). A straight line fit of the correlation, trace 620, is also included to demonstrate the linearity of the correlation over a relatively large span of substrate temperatures, from 20 to 160° C.

The differential acoustic time of flight method of substrate temperature measurement can be used with both antisymmetric and symmetric Lamb wave excitation, though obviously the latter is preferred due to low dispersion and thus easier signal recognition, but the former may be used as well if the waveforms can be recognized. Furthermore, the method can also be used in mixed-mode excitation cases, where for example, the difference of times of flight of a symmetric Lamb wave and an antisymmetric Lamb wave, both propagating along the same or different acoustic paths, is determined, and from that quantity the substrate temperature can be determined as well.

All of the functions required for determination of the difference of times of flight and the substrate temperature can be implemented in software embedded in controlled 250 of the substrate temperature measurement system 200, of FIG. 2, for example.

Figure 7A:
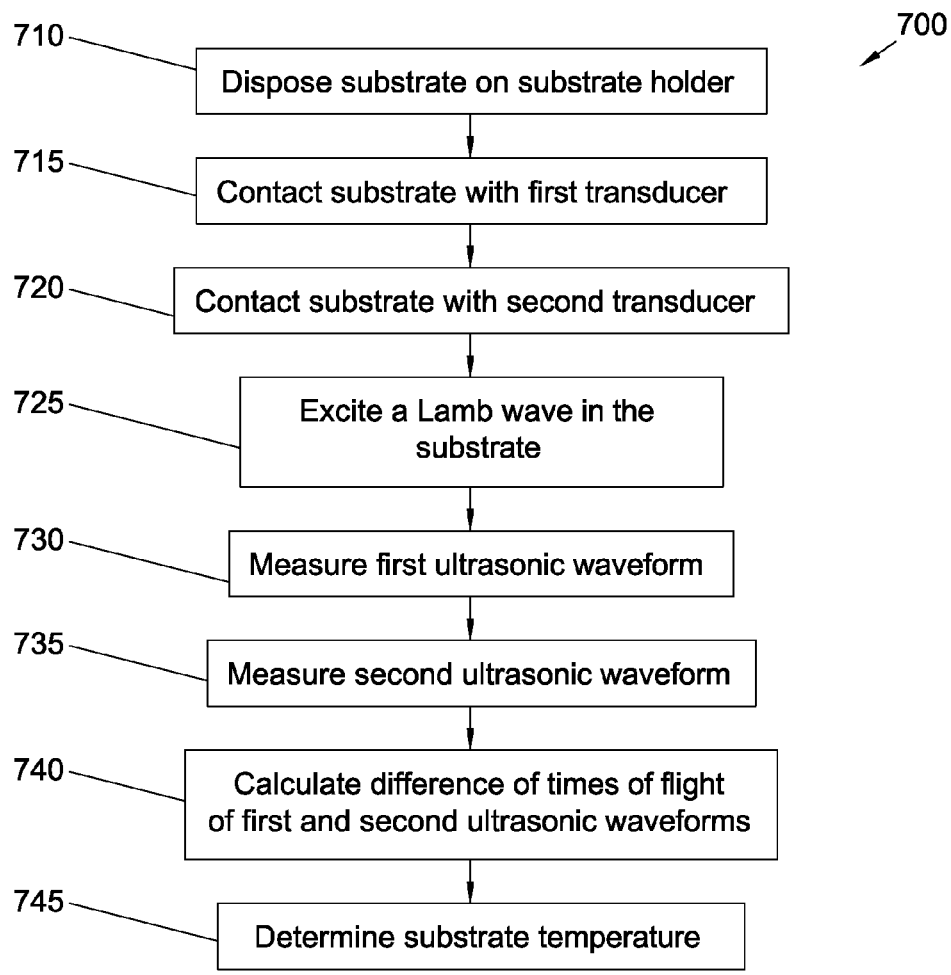
FIG. 7A is an exemplary flowchart of a method for substrate temperature measurement in accordance with an embodiment of the invention.

FIG. 7A now summarizes an exemplary process of 700 of measuring the substrate temperature in accordance with an embodiment of the invention. In step 710, a substrate is disposed on a substrate support, such as an electrostatic chuck 205 of FIG. 2, a mechanical chuck, or alternatively a plurality of substrate edge supports or a plurality of lift pins.

In steps 715 and 720, the substrate 100 is contacted with a first and second ultrasonic transducers, such as transducers 220 of FIG. 2, and T and R of FIGS. 3A and 3B.

In step 725, a symmetric Lamb wave is excited in the substrate 100 using ultrasonic transducers in contact with the substrate.

In steps 730 and 735, the first and second ultrasonic waveforms, such as waveforms 410 and 420 of FIG. 4, are measured using ultrasonic transducers in contact with the substrate. The first and second ultrasonic waveforms represent the symmetric Lamb propagating along different paths in substrate 100, as is shown in exemplary configurations depicted in FIGS. 3A and 3B.

In step 740, the difference of times of flight of the first and second waveforms is calculated from the measured waveforms.

The method concludes at step 745, in which the difference of time of flight is converted to a temperature measurement, using known wave propagation lengths along paths 310 and 320, of FIGS. 3A and 3B, for example, and using the known temperature dependence of the speed of sound for the material of the substrate.

Figure 7B:
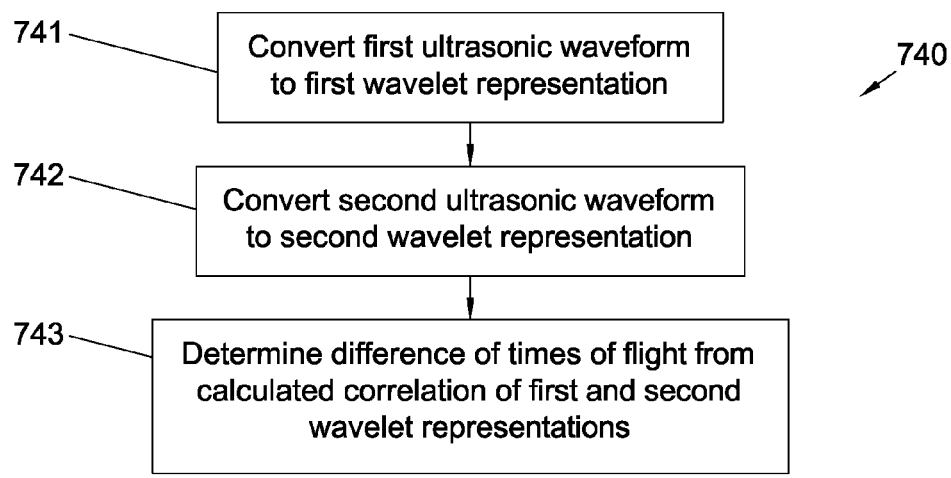
FIG. 7B is an exemplary flowchart of a method for determining the difference of times of flight of ultrasonic waveforms in accordance with an embodiment of the invention.

FIG. 7B expands the step 740 of calculating the difference of times of flight, in accordance with an embodiment of the invention, to include the steps 741 and 742, of converting the first and second waveform into respective wavelet transformations, followed by calculation of the correlation of the first and second wavelets, from which the difference of times of flight $t_R$ is determined by peak detection As was previously mentioned, determining the temperature distribution in a substrate is of particular importance because it allows an assessment to be made of the uniformity of substrate processing, and allows corrective action to be taken, increasing device yield from the same substrate.

The previously-described embodiments for measuring a single substrate temperature can be readily extended to measure substrate temperature across a plurality of substrate zones, which measurements can in turn be fitted to a predetermined functional form for the temperature distribution, for example, yielding a full temperature distribution across the entire substrate (or portion thereof).

Figure 8:
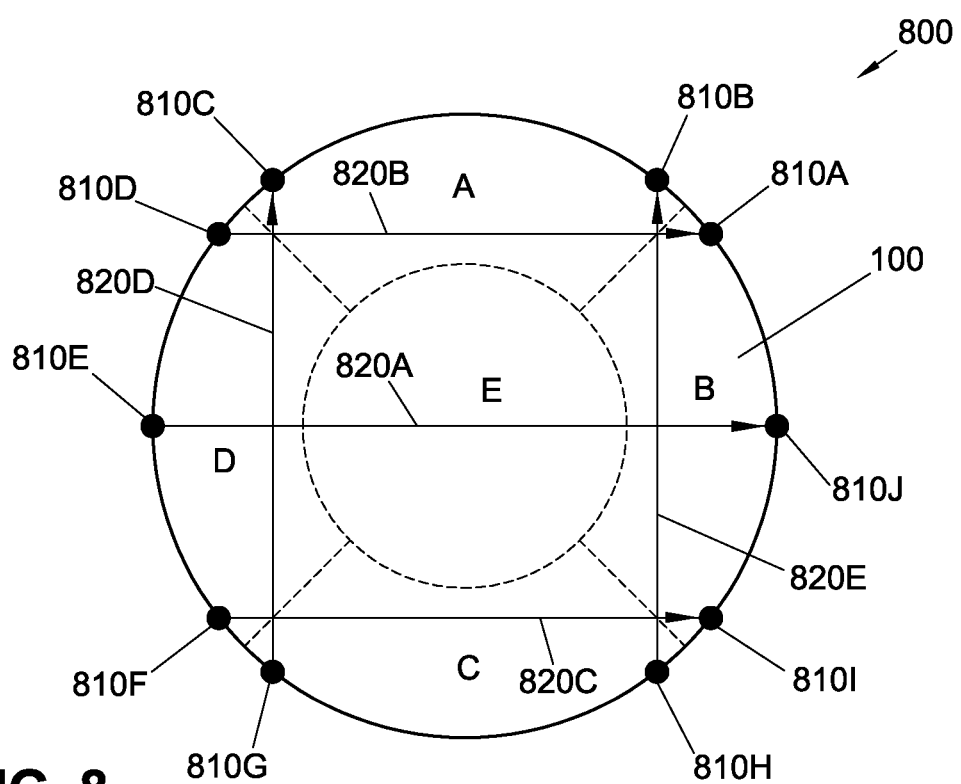
FIG. 8 is a schematic of locations of a plurality of ultrasonic transducers to be used in conjunction with a method for determination of the substrate temperature distribution, in accordance with another embodiment of the invention.

FIG. 8 shows a schematic of an exemplary embodiment of a temperature distribution measurement system and method. The substrate 100 is contacted by a plurality of ultrasonic transducers 810A, 810B, 810C, . . . 810J, at various locations along the circumference of the substrate 100. Locations of contact for ultrasonic transducer are selected to allow multiple temperature measurements to be made along paths 820A, 820B, 820C, 820D, and 820E, traversing the substrate 100 which is subdivided into zones A, B, C, D, and E. Zones A, B, C, and D roughly correspond to paths 820B, 820C, 820D, and 820E. The path 820A traverses multiple zones D, E, and B, so the temperature measurement in zone A can be determined from the temperature measurement along path 820A, using previously-determined temperatures of zones B and D in a weighted average, or similar scheme. Once the temperatures of all individual zones A, B, C, D, and E are known, the values of the temperatures can be fitted to a previously selected functional form for the temperature, which functional form involves floating parameters, i.e. coefficients, which can be fitted using a method such as regression, yielding a temperature distribution function for substrate 100, which can be evaluated at any location, i.e. coordinate pair, across substrate 100. Suitable functions include various polynomials and function suitable for fitting to a circularly-symmetric geometry, such as Zernike polynomials.

In the exemplary embodiment in FIG. 8, ten ultrasonic transducers and five zones are used. In other embodiments, a larger or smaller number of ultrasonic transducers and a larger or smaller number of zones can be used, depending on the needed accuracy of the measurements.

In a further embodiment of the invention, tomographic inversion can be used to establish the temperature distribution from known temperatures measured along paths A, B, C, D, and E of the exemplary embodiment of FIG. 8. Tomographic inversion may involve the use of the Radon transform, or other similar algorithm to establish the full temperature distribution.

Figure 9:
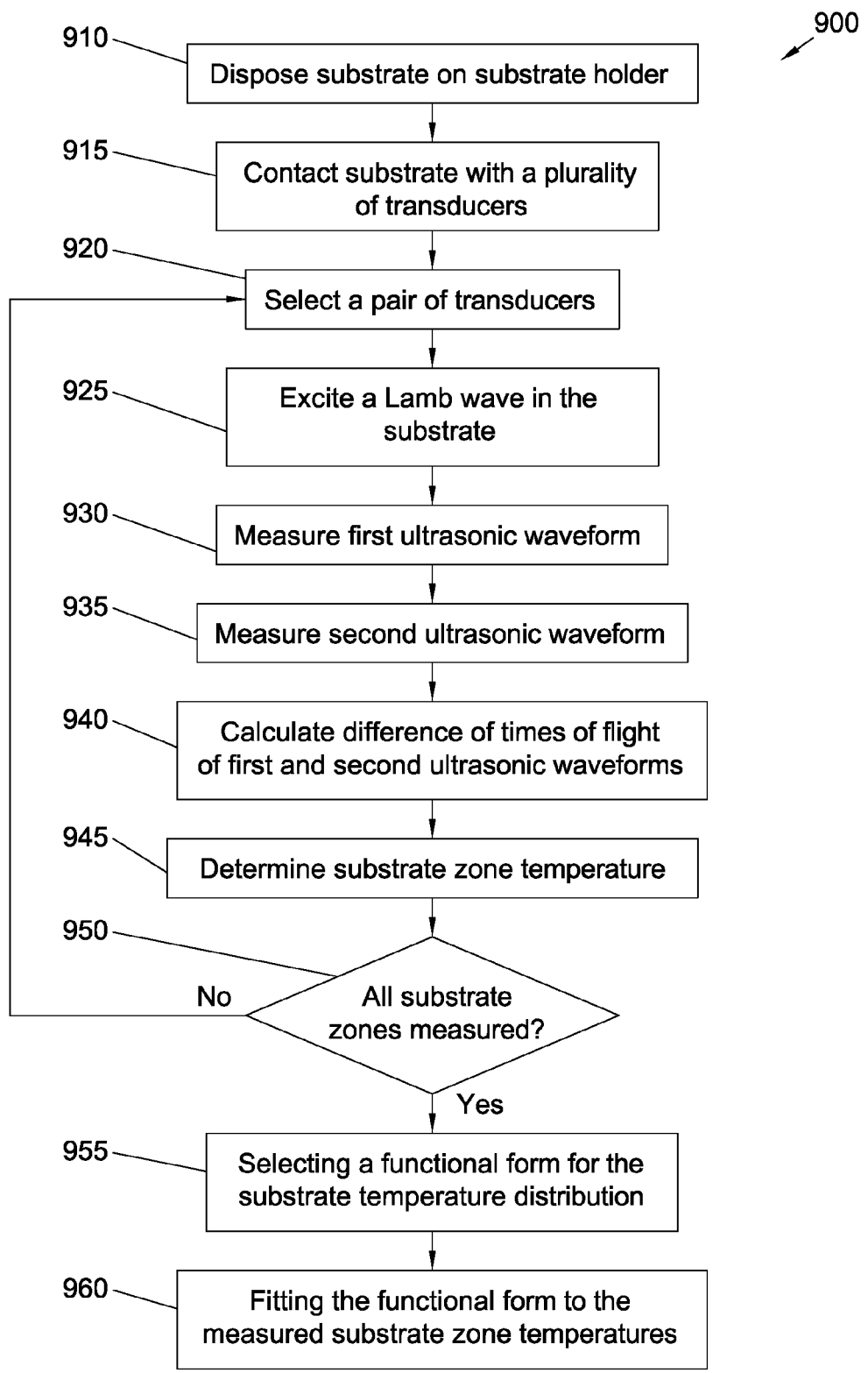
FIG. 9 is an exemplary flowchart of a method for determining the substrate temperature distribution in accordance with another embodiment of the invention.

FIG. 9 now summarizes an exemplary process of 900 of measuring the substrate temperature distribution in accordance with an embodiment of the invention. In step 910, a substrate is disposed on a substrate support, such as an electrostatic chuck 205 of FIG. 2, a mechanical chuck, or alternatively a plurality of substrate edge supports or a plurality of lift pins.

In step 915, the substrate 100 is contacted by a plurality of ultrasonic transducers, as shown in the exemplary embodiment of FIG. 8.

In step 920, a pair of ultrasonic transducers is selected, for example, a pair of ultrasonic transducers corresponding to a desired path A, B, C, D, or E of the exemplary embodiment of FIG. 8.

In step 925, a symmetric Lamb wave is excited in the substrate 100 using only the selected pair of ultrasonic transducers.

In steps 930 and 935, the first and second ultrasonic waveforms, such as waveforms 410 and 420 of FIG. 4, are measured using the selected pair of ultrasonic transducers. The first and second ultrasonic waveforms represent the symmetric Lamb propagating along different paths in substrate 100, which paths connect the selected pair of transducers.

In step 940, the difference of times of flight of the first and second waveforms is calculated from the measured waveforms. Optionally, wavelet representations and correlation of wavelet representation can be used as part of this step, in accordance with the flowchart of FIG. 7B.

In step 945, the difference of time of flight is converted to a temperature measurement for a zone defined by the path between the selected pair of ultrasonic transducers, using known wave propagation lengths, and using the known temperature dependence of the speed of sound for the material of the substrate. Given that the temperature measurement is made in a zoned manner, this allows the possibility of variation of the temperature dependence of the speed of sound across various zones to be accounted for, if such a variation exists. In most case, the temperature dependence of the speed of sound will be the same across the entire substrate 100.

In step 950, a determination is made if all zonal temperature measurements have been made, and if so, the method proceeds to step 955. If not, the method proceeds again with step 920 in which a new pair of ultrasonic transducers is selected, and a new zonal temperature measurement is made.

In step 955, the method proceeds with optionally selecting a functional forms for the substrate temperature distribution. This, and subsequent steps are optional because there are situations where individual zonal temperature measurements suffice to define the temperature distribution in of substrate 100, and a full functional form is unnecessary.

In step 960, following the selection of the functional form 955, the functional form is fitted to the zonal temperature measurements, and floating parameters or coefficients of the selected functional form are determined by e.g. regression, to determine the final functional form of the substrate temperature distribution.

An alternative to steps 955 and 960 would involve the use of tomographic inversion to determine the substrate temperature distribution.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method for determining the temperature of a substrate, comprising:
    disposing the substrate on a substrate support;
    contacting the substrate with a first ultrasonic transducer;
    contacting the substrate with a second ultrasonic transducer;
    exciting a Lamb wave in the substrate by energizing the first ultrasonic transducer and the second ultrasonic transducer;
    measuring at the second ultrasonic transducer a first ultrasonic waveform of the Lamb wave originating at the first ultrasonic transducer and propagating along a first path from the first ultrasonic transducer to the second ultrasonic transducer;
    measuring at the second ultrasonic transducer a second ultrasonic waveform of the Lamb wave originating from the first ultrasonic transducer and propagating along a second path from the first ultrasonic transducer to the second ultrasonic transducer, wherein the second path is different than the first path;
    calculating a difference of times of flight of the second ultrasonic waveform and the first ultrasonic waveform, and
    determining the substrate temperature from the calculated difference of times of flight and from a known temperature dependence of the speed of sound for the substrate material.

2. The method of claim 1, wherein the Lamb wave is a symmetric Lamb wave.

3. The method of claim 1, wherein the Lamb wave is excited by energizing the first ultrasonic transducer and the second ultrasonic transducer in pulsed mode.

4. The method of claim 1, wherein the first path is the shortest path between the first ultrasonic transducer and the second ultrasonic transducer.

5. The method of claim 1, wherein the second path is longer than the first path.

6. The method of claim 1, wherein the second path comprises at least one reflection from the substrate edge.

7. The method of claim 1, wherein the first and second ultrasonic transducers contact the substrate edge at substantially diametrally-opposed locations on the substrate.

8. The method of claim 1, wherein the first and second ultrasonic transducers are located proximate to each other, but not touching each other, while contacting the substrate edge.

9. The method of claim 1, wherein the calculating of the difference of times of flight comprises:
converting the first ultrasonic waveform into a first wavelet representation;
converting the second ultrasonic waveform into a second wavelet representation; and
determining the difference of times of flight from a calculated correlation of the first and second wavelet representations.

10. The method of claim 1, wherein the substrate temperature is determined during a semiconductor processing step performed in a semiconductor processing tool.

11. A system for determining a temperature of a substrate, comprising:
a first ultrasonic transducer configured to contact the edge of the substrate;
a second ultrasonic transducer configured to contact the edge of the substrate;
a controller for controlling the first and second ultrasonic transducers, the controller being configured to:
provide power to energize the first and second ultrasonic transducers to excite a symmetric Lamb wave in the substrate;
measure ultrasonic waveforms received by at least the second ultrasonic transducer;
calculate a difference of times of flight of a first ultrasonic waveform and a second ultrasonic waveform propagating along a first path and a second path in the substrate and measured by the second ultrasonic transducer, respectively; and
calculate a substrate temperature from the calculated difference of times of flight and a known temperature dependence of the speed of sound for the substrate material.

12. The system of claim 11, wherein the symmetric Lamb wave is excited by energizing the first ultrasonic transducer and the second ultrasonic transducer in pulsed mode.

13. The system of claim 11, wherein the first and second ultrasonic transducers each comprise:
a transducer element, and
a buffer rod coupled to the transducer element, and configured to contact the substrate edge.

14. The system of claim 11, wherein the first and second ultrasonic transducers contact the substrate edge at substantially diametrally-opposed locations on the substrate.

15. The system of claim 11, wherein the first and second ultrasonic transducers are located proximate to each other, but not touching each other, while contacting the substrate edge.

16. The system of claim 11, wherein the controller is configured to calculate the difference of times of flight by converting the first ultrasonic waveform into a first wavelet representation; converting the second ultrasonic waveform into a second wavelet representation, calculating a correlation of the first and second wavelet representations; and determining the difference of times of flight from the calculated correlation of the first and second wavelet representations.

17. The system of claim 11, further comprising:
a first actuator for selectably bringing into contact with, or withdrawing from the substrate, the first ultrasonic transducer, and
a second actuator for selectably bringing into contact with, or withdrawing from the substrate, the second ultrasonic transducer.

18. A method for determining the temperature distribution of a substrate, comprising:
disposing the substrate on a substrate support;
contacting the substrate with a plurality of ultrasonic transducers;
measuring a plurality of substrate temperatures in a plurality of substrate zones, each temperature measurement in each substrate zone comprising:
selecting a substrate zone in which the substrate temperature is to be measured;
exciting a Lamb wave in the substrate by energizing a selected pair of ultrasonic transducers from the plurality of ultrasonic transducers;
measuring at a second ultrasonic transducer of the selected pair of ultrasonic transducers a first ultrasonic waveform of the Lamb wave originating at a first ultrasonic transducer of the selected pair of ultrasonic transducers and propagating along a first path from the first ultrasonic transducer of the selected pair of ultrasonic transducers to the second ultrasonic transducer of the selected pair of ultrasonic transducers;
measuring at the second ultrasonic transducer of the selected pair of ultrasonic transducers a second ultrasonic waveform of the Lamb wave originating from the first ultrasonic transducer of the selected pair of ultrasonic transducers and propagating along a second path from the first ultrasonic transducer of the selected pair of ultrasonic transducers to the second ultrasonic transducer of the selected pair of ultrasonic transducers, wherein the second path is different than the first path;
calculating a difference of times of flight of the second ultrasonic waveform and the first ultrasonic waveform;
determining a temperature of the selected substrate zone from the calculated difference of times of flight and from a known temperature dependence of the speed of sound for the substrate material.

19. The method of claim 18, wherein the Lamb wave is a symmetric Lamb wave.

20. The method of claim 18, further comprising:
selecting a functional form for the temperature distribution of the substrate, the selected functional form having a plurality of floating parameters; and
calculating the plurality floating parameters by fitting the plurality of substrate temperatures measured in the plurality of substrate zones.

* * * * *